US006300769B1

(12) United States Patent
Phan

(10) Patent No.: US 6,300,769 B1
(45) Date of Patent: Oct. 9, 2001

(54) FAST COMPARATOR SUITABLE FOR BIST AND BISR APPLICATIONS

(75) Inventor: Tuan Phan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/466,519

(22) Filed: Dec. 17, 1999

(51) Int. Cl.$^7$ .................................................. H01H 31/02
(52) U.S. Cl. ............................................................ 324/537
(58) Field of Search ........................ 324/537; 340/146.2; 365/201, 189.07; 327/79, 451, 74

(56) References Cited

U.S. PATENT DOCUMENTS

| 5,471,188 | * | 11/1995 | Chappell et al. | 340/146.2 |
| 5,684,849 | * | 11/1997 | Ueno | 377/54 |
| 6,057,709 | * | 5/2000 | Hesley | 326/54 |

\* cited by examiner

Primary Examiner—Safet Metjahic
Assistant Examiner—E P LeRoux

(57) ABSTRACT

Accordingly, there is disclosed herein a fast word compare circuit suitable for use in a BIST or BISR environment. In one embodiment, the comparator includes a front end and a zero-detector circuit. The front end receives two or more words and compares them bitwise, generating a set of bit match signals that indicate which bits match. The zero detector receives the bit match signals from the front end and asserts an output signal when all the bit match signals indicate a match. The front end may consist of a set of exclusive-or (XOR) gates, each configured to generate a bit match signal from respective bits of the input words. The zero detector may include a set of bit transistors coupled in parallel between a first node and ground. Each bit transistor receives a respective bit match signal and conducts when the respective bit match signal is asserted. A first clock transistor may be coupled between the first node and a second node and configured to conduct when a clock signal is asserted, and a second clock transistor may be coupled between a positive source voltage and the second node and configured to conduct when the clock signal is de-asserted. If a pull-up resistance is provided, this allows the first or second node to indicate the match or mismatch of the input words. Further robustness may be provided by a Schmitt-trigger configuration coupled to the second node.

21 Claims, 5 Drawing Sheets

FAST COMPARATOR SUITABLE FOR BIST AND BISR APPLICATIONS

BACKGROUND OF THE INVENTION

1. Field of the Invention

This invention relates to the field of digital electronic devices, and in particular to a fast method and circuit for comparing two words and suitable for use in built-in self-test and built-in self-repair modules.

2. Description of the Related Art

Since users generally depend upon the reliability of memory chips and other integrated circuits for their own systems to function properly, it is common practice for the chip manufacturers to test the functionality of chips at the manufacturing site before the chips are sold to users. The manufacturers' reputations depend upon the reliability of their chips. As the line width within an integrated circuit chip continues to shrink, this reliability becomes more difficult to achieve. An ongoing challenge for the chip manufacturers is to increase the number and density of transistors on a chip without sacrificing reliability or suffering decreasing chip yields due to malfunctioning parts.

Before the chips are released for shipment, they typically undergo testing to verify that the circuitry for each of the major on-chip modules is functioning properly. One standard way for testing chips involves using an external memory tester or Automatic Test Equipment (ATE) at the manufacturing site. An external memory tester supplies power and applies test patterns to the chip to detect faults. External testers can only test a limited number of chips at a time, and the test speed is limited by the external bus speed. Consequently, this method of testing is expensive in terms of time requirements and equipment costs.

Partly to address these issues, and partly to provide off-site testing, built-in self-test (BIST) units are now commonly incorporated into memory chips and other integrated circuits. Automated test equipment can now be simplified to the extent that the only necessary functions are to supply power (and sometimes a clock signal) to the chip, and to monitor a single output signal from the chip. The on-board BIST unit generates all the test patterns and asserts (or de-asserts) the output signal if the chip passes the functionality test. The BIST can be configured to run every time the chip is powered-on, or the BIST may be configured to run only when a test mode signal is asserted.

A memory BIST unit operates by writing and reading various patterns to/from the memory to determine various kinds of memory faults. In general, a memory BIST unit writes a data value to a memory cell and subsequently reads the memory cell. By comparing the data written and the data subsequently returned from the memory cell, the memory BIST unit is able to determine whether the memory cell is faulty. If too many errors are detected, then the fault may exist in the support circuitry for the memory cell array.

It is not uncommon for a significant percentage of the memory cells within a memory chip to fail because of defects in the substrate or errors in the manufacturing process. To compensate for this, many memory chips are provided with a set of extra memory cells that can be used in place of the defective ones. Configuring the memory chip to replace the defective cells is termed "Repairing" the memory array. Some memory repair is performed at the manufacturing site. Conventional repairing techniques bypass the defective cells using fuseable links that cause address redirection. However, these techniques require significant capital investment for implementing the repairing process, and moreover they fail to address the possibility of failure after shipment from the manufacturing facility.

To reduce repair costs and allow field repairs, some memory chips have been equipped with built-in self test (BIST) and built-in self repair (BISR) circuitry. The BIST circuit detects faults in the memory array and notifies the BISR circuit of the fault locations. The BISR circuitry generally reassigns the row or column containing the failing cell to a spare row or column in the memory array. BIST and BISR are typically performed each time power is applied to the system. This allows any latent failures that occur between subsequent system power-ups to be detected in the field.

Unfortunately, providing BIST and BISR for a memory chips lengthens the required pause time between power-on and the first usage of the memory chip. Furthermore, usage of a BISR unit limits the memory access speed by adding to the memory access times. Consequently, it is desirable to increase the speed of BIST and BISR circuitry in an inexpensive manner.

SUMMARY OF THE INVENTION

Accordingly, there is disclosed herein a fast word compare circuit suitable for use in a BIST or BISR environment. In one embodiment, the comparator includes a front end and a zero-detector circuit. The front end receives two or more words and compares them bitwise, generating a set of bit match signals that indicate which bits match. The zero detector receives the bit match signals from the front end and asserts an output signal when all the bit match signals indicate a match. The front end may consist of a set of exclusive-or (XOR) gates, each configured to generate a bit match signal from respective bits of the input words. The zero detector may include a set of bit transistors coupled in parallel between a first node and ground. Each bit transistor receives a respective bit match signal and conducts when the respective bit match signal is asserted. A first clock transistor may be coupled between the first node and a second node and configured to conduct when a clock signal is asserted, and a second clock transistor may be coupled between a positive source voltage and the second node and configured to conduct when the clock signal is de-asserted. If a pull-up resistance is provided, this allows the first or second node to indicate the match or mismatch of the input words. Further robustness may be provided by a Schmitt-trigger configuration coupled to the second node.

BRIEF DESCRIPTION OF THE DRAWINGS

Other objects and advantages of the invention will become apparent upon reading the following detailed description and upon reference to the accompanying drawings in which.

Figure 1:
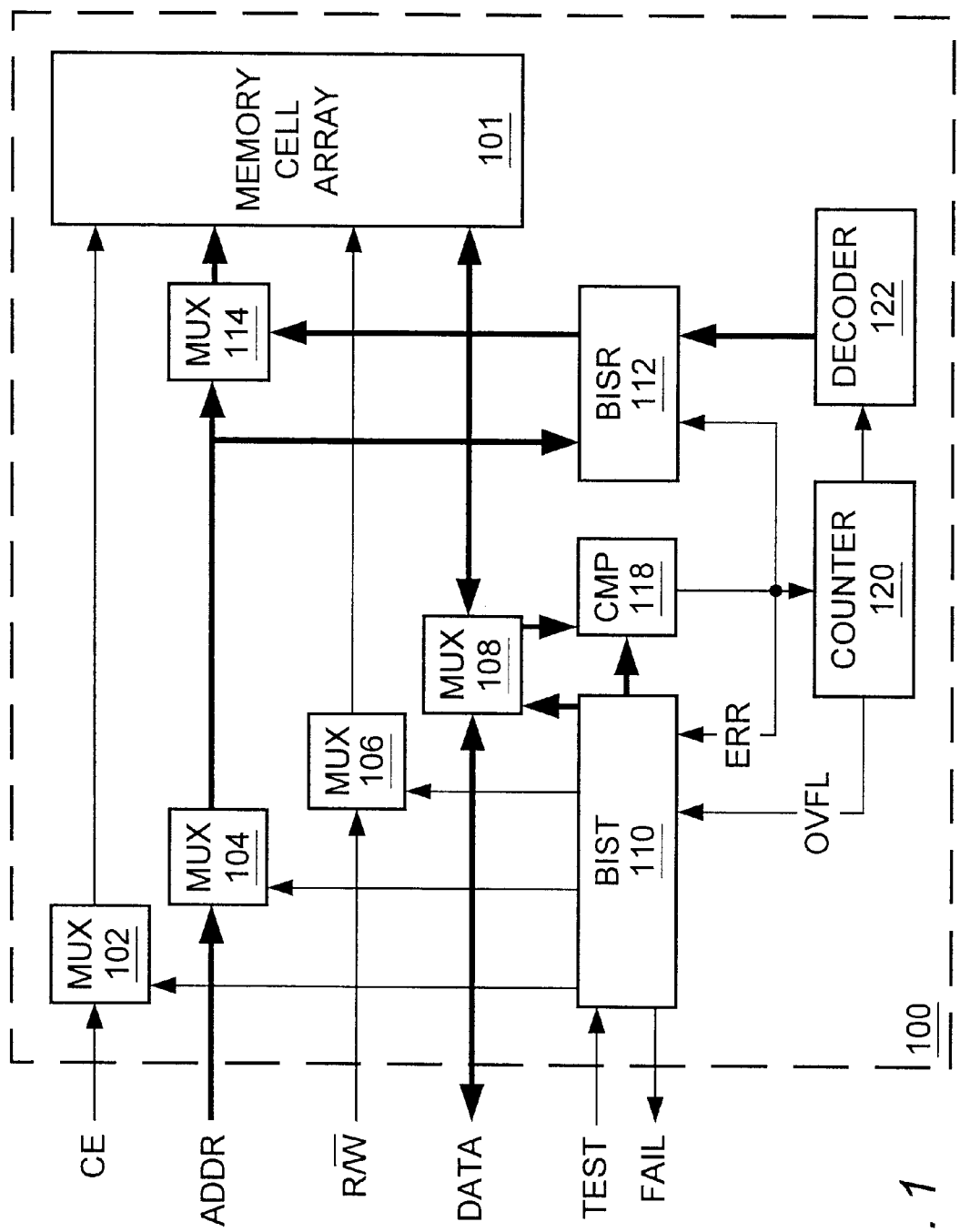
FIG. 1 depicts a functional block diagram of a memory equipped with BIST and BISR according to one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following description, the terms "assert" and "de-assert" are used when discussing logic signals. When a logic signal is said to be asserted, this indicates that an active-high signal is driven high, whereas an active-low signal is driven low. Conversely, de-assertion indicates that an active-high signal is driven low, and that an active-low signal is driven high. As used herein, the term "BIST" refers to the actual test, while "BIST unit" and "BIST circuitry" refer to the circuitry that performs BIST. Similarly, "BISR" refers to the process of built-in self repair, while "BISR unit" and "BISR circuitry" refer to the circuitry that performs BISR.

DETAILED DESCRIPTION OF THE INVENTION

Turning now to the figures, FIG. 1 shows a memory 100 having a set of signal lines that include a chip enable line (CE), an address bus (ADDR), a read/write line (R/$\overline{W}$), a bi-directional data bus (DATA), a test line (TEST), and a fail line (FAIL). A set of multiplexers 102, 104, 106, and 108 allows a BIST unit 110 to take control of the CE, ADDR, R/$\overline{W}$, and DATA lines, respectively, when the TEST line is asserted. The CE, R/$\overline{W}$ and DATA lines from multiplexers 102, 106, 108 connect to memory cell array 101. The ADDR lines from multiplexer 104 couple to a second multiplexer 114 which allows a BISR unit 112 to re-direct memory accesses when faulty locations are addressed.

Figure 2:
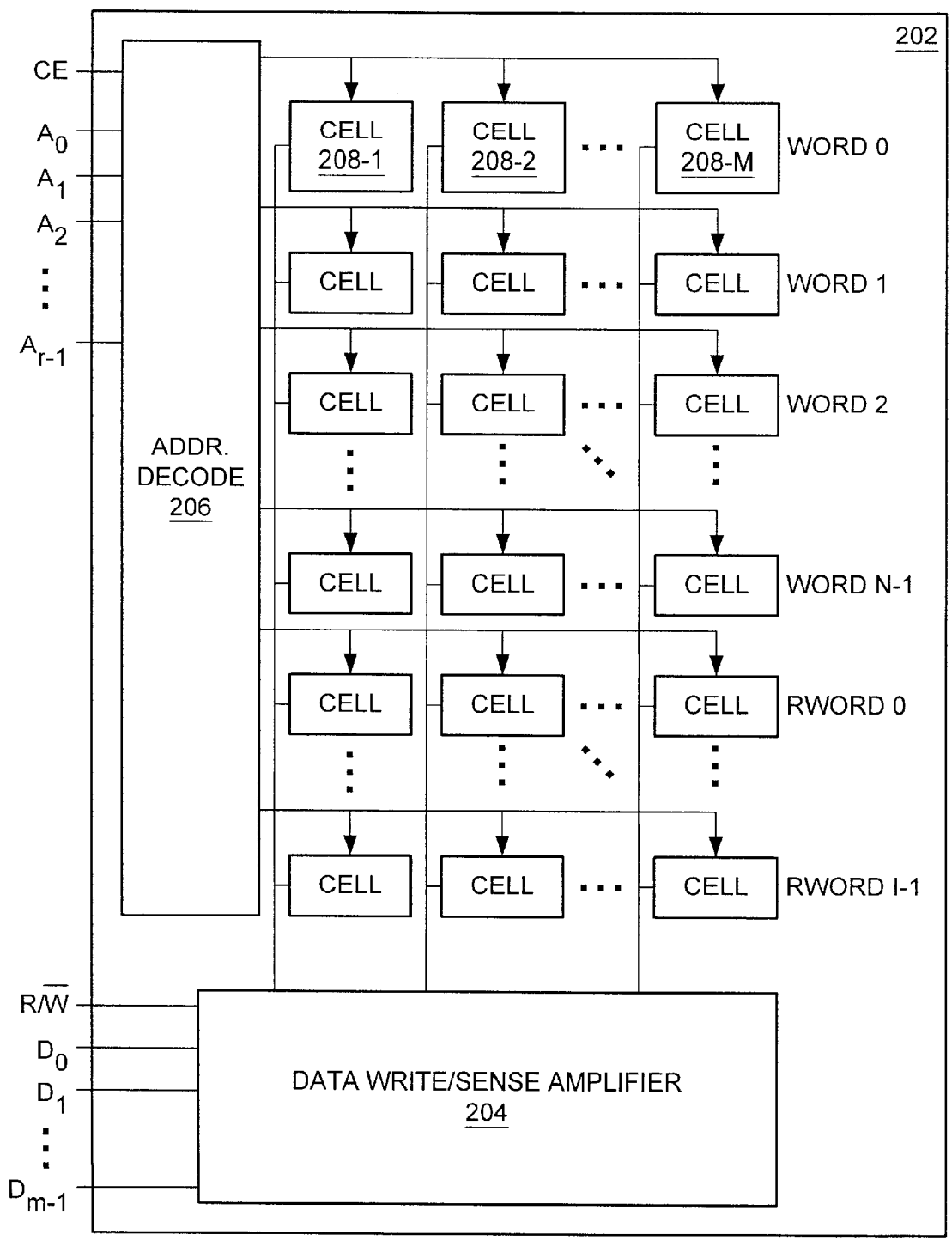
FIG. 2 depicts a functional block diagram of a memory cell array with supporting circuitry.

Referring now to FIG. 2, when the CE line is asserted, address decoder 206 asserts a word line to access a cell or set of cells 208 in memory cell array 202 that corresponds to the value on the address lines. If the R/$\overline{W}$ line is asserted, the data from the accessed cells is amplified and driven onto the DATA lines by data write/sense amplifier 204. Otherwise, the data write/sense amplifier 204 stores binary values provided on the DATA lines into the accessed cells.

Returning to FIG. 1, when the TEST line is asserted, the BIST unit 110 takes control of the CE, ADDR, R/$\overline{W}$, and DATA lines, and conducts a pattern of read and write operations designed to detect faults in the memory cell array. During write operations, the BIST unit 110 supplies test data to the memory cell array on the DATA lines. During read operations, the BIST unit 110 supplies expected output data to the comparator 118, and the comparator 118 compares values on the DATA lines to the expected output. When a mismatch is detected, comparator 118 asserts an error signal line (ERR). A counter 120 increments an error count every time the ERR line is asserted, and a decoder 122 asserts an error number line that corresponds to the error count. Counter 120 also produces an overflow signal (OVFL) that is asserted when the number of detected errors exceeds the number of extra locations available. Upon detecting assertion of the OVFL signal, BIST unit 110 ceases testing and holds the FAIL line in an asserted state. If the testing completes without assertion of the OVFL signal, BIST unit 110 de-asserts the FAIL line.

BISR circuits traditionally employ memories or latches that store the addresses of the failing rows or columns. During operation, incoming addresses are supplied to the failing address memory, and the failing address memory asserts a "hit" signal if the incoming address corresponds to one of the stored failing addresses. A rerouting operation is then performed to conduct the desired memory operation on a replacement row or column in the memory array.

Figure 3:
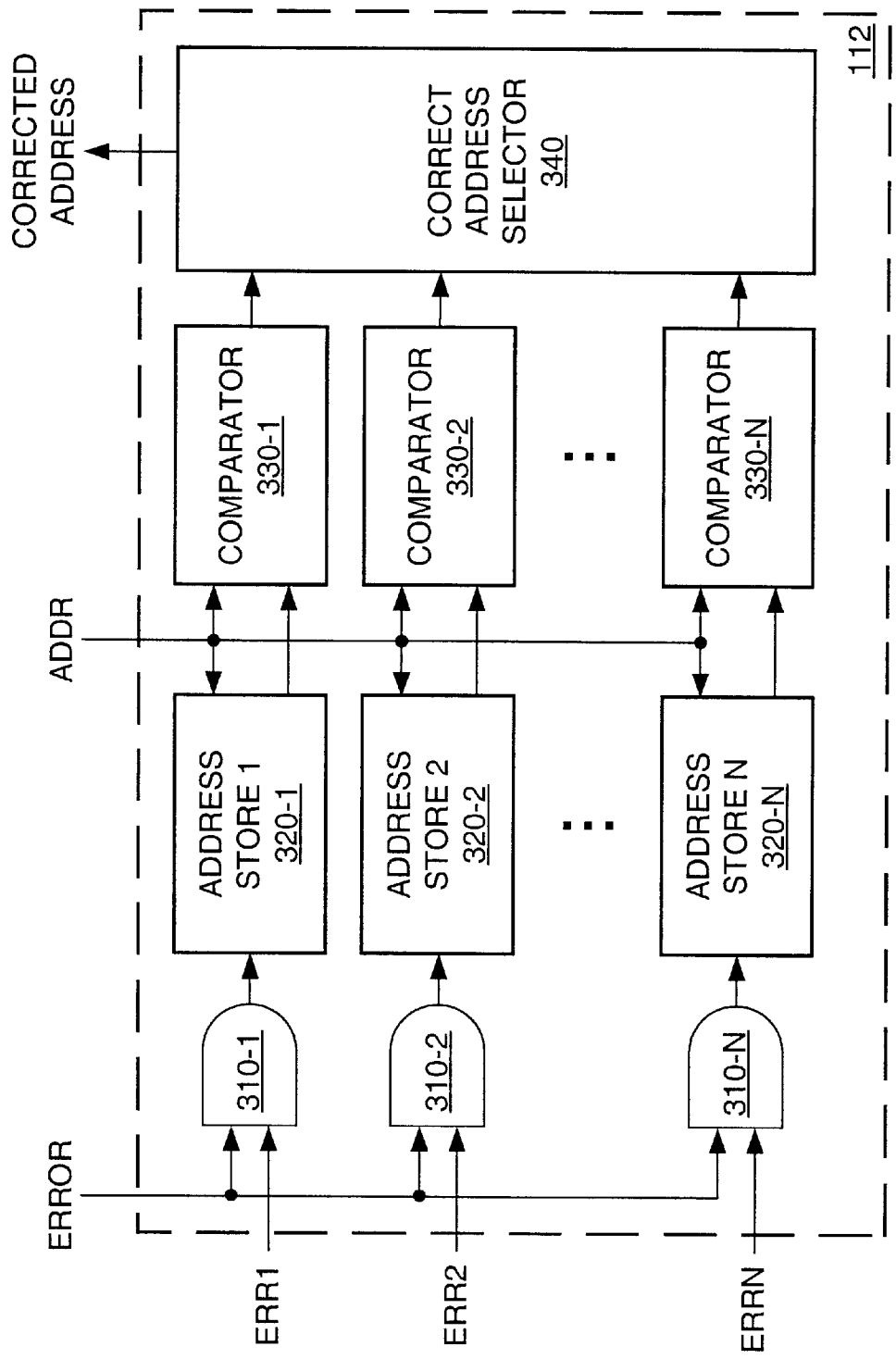
FIG. 3 depicts a functional block diagram of a BISR module according to one embodiment.

Referring simultaneously to both FIG. 1 and FIG. 3, the error count is initially zero, and decoder 122 asserts the first error number line (In FIG. 3, the error number lines from decoder 122 are labeled ERR1 through ERRN). This signal is blocked by a logical AND gate 310-1 until an error is detected and comparator 118 momentarily asserts the error signal. This momentary assertion allows the logical AND gate 310-1 to pulse a clock signal to address store 320-1. Counter 120 increments and decoder 122 then asserts the second error number line ERR2 to logical AND gate 310-2. A subsequent defect detection would similarly cause logical AND gate 310-2 to pulse the clock signal to address store 320-2.

Address stores 320 each latch the address signal as their clock signals are asserted. The latched addresses and a comparator enable signal are provided from the address stores to corresponding comparators 330. When enabled, the comparators 330 each compare the incoming ADDR line values to the latched address values. If a match is detected, the comparators assert a match signal to a correct address selector 340, which then provides a corrected address to multiplexer 114.

The repair circuit 112 is configured to remap faulty rows as they are detected. Consequently, faulty rows are replaced by potentially un-initialized rows in the middle of testing. The BIST unit 110 prevents the potentially incorrect values stored in a replacement row from manifesting as an error in any subsequent accesses to the address where the error was detected. In one embodiment, the BIST unit 110 is configured to write a suitable value to the address after the replacement occurs and before proceeding with the testing. In another embodiment, the BIST unit 110 tracks the faulty addresses and disables the comparator 118 during subsequent reads from the faulty addresses. In yet another embodiment, the BIST unit 110 re-starts the test after a row is replaced. In any case, the FAIL signal should not be de-asserted until the BIST unit 110 has performed a complete test without detecting any faults. Accordingly, if one or more faults is detected and repaired during a test, the BIST unit should repeat the test to verify the functionality of the repairs.

Memory 100 may alternatively be configured to allow BIST unit 110 to locate all the defects in memory cell array 114 before attempting any repairs. This configuration allows for determination of an optimal remapping solution when both columns and rows are being replaced, but requires a significantly more complex BIST unit implementation.

Figure 4:
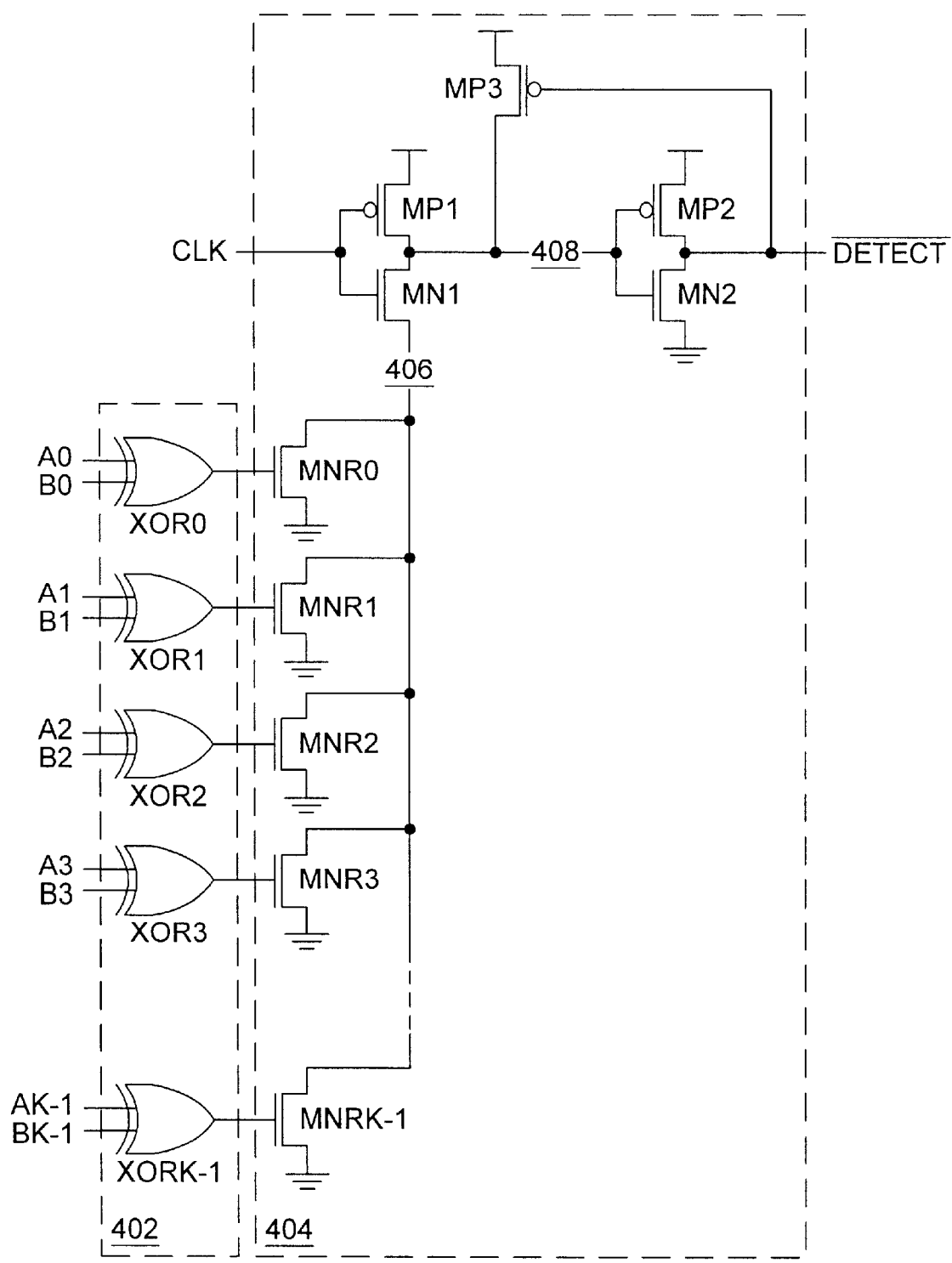
FIG. 4 depicts a circuit schematic for a fast compare circuit embodiment.

FIG. 4 shows a preferred embodiment of comparator 118 and comparators 330. The comparator configuration of FIG. 4 includes an exclusive-or (XOR) front end 402 and a zero-detect circuit 404. The bits of the two words to be compared (A0 through AK-1 and B0 through BK-1) are provided to front end 402. A set of K XOR gates compares each of the K bits of word A to the respective bit from word B. When two respective bits match, the XOR gate outputs a low signal. Otherwise, the XOR gate outputs a high signal.

Zero detect circuit 404 includes an N-type MOSFET transistor for each input bit (MNR0 through MNRK-1). The bit transistors are coupled in parallel between ground and NAND node 406. If a mismatch is detected in any of the bits, the corresponding XOR gates assert their output signals, and the corresponding bit transistors conduct, providing a low-impedance path to ground. If all the bits match, NAND node 406 will possess a high-impedance path to ground.

Clock signal CLK is received by clock transistors MP1 and MN1, and alternates between high and low values. When the clock signal is low, decision node 408 is high. The decision node 408 value is provided to inversion transistors MP2 and MN2. When the decision node 408 is high, the detect signal is asserted low. A feedback transistor MP3 assists in pulling the decision node high when the detect signal is low, but shuts off when the detect signal is high. The feedback transistor MP3 is a long-channel MOSFET transistor that is fairly weak (i.e. resistive). This gives the inversion operation of transistors MP2 and MN2 a Schmitt-trigger characteristic.

When the clock signal CLK goes high, decision node 408 is coupled to NAND node 406. When NAND node 406 has a low impedance path to ground (due to mismatched words), decision node 408 is pulled low, and the detection signal is de-asserted (high). Otherwise, when NAND node 406 has a high impedance path to ground, the decision node 408 stays high and the detection signal stays asserted (low).

It is noted that alternative configurations of the zero detector circuitry are contemplated as being within the scope of the attached claims. These include a zero detector without the inversion and feedback transistors, a zero detector implemented using complementary logic (p-type transistors swapped with n-type transistors and source voltages exchanged with ground). The NAND node 404 may additionally be equipped with a pull-up resistance.

Figure 5:
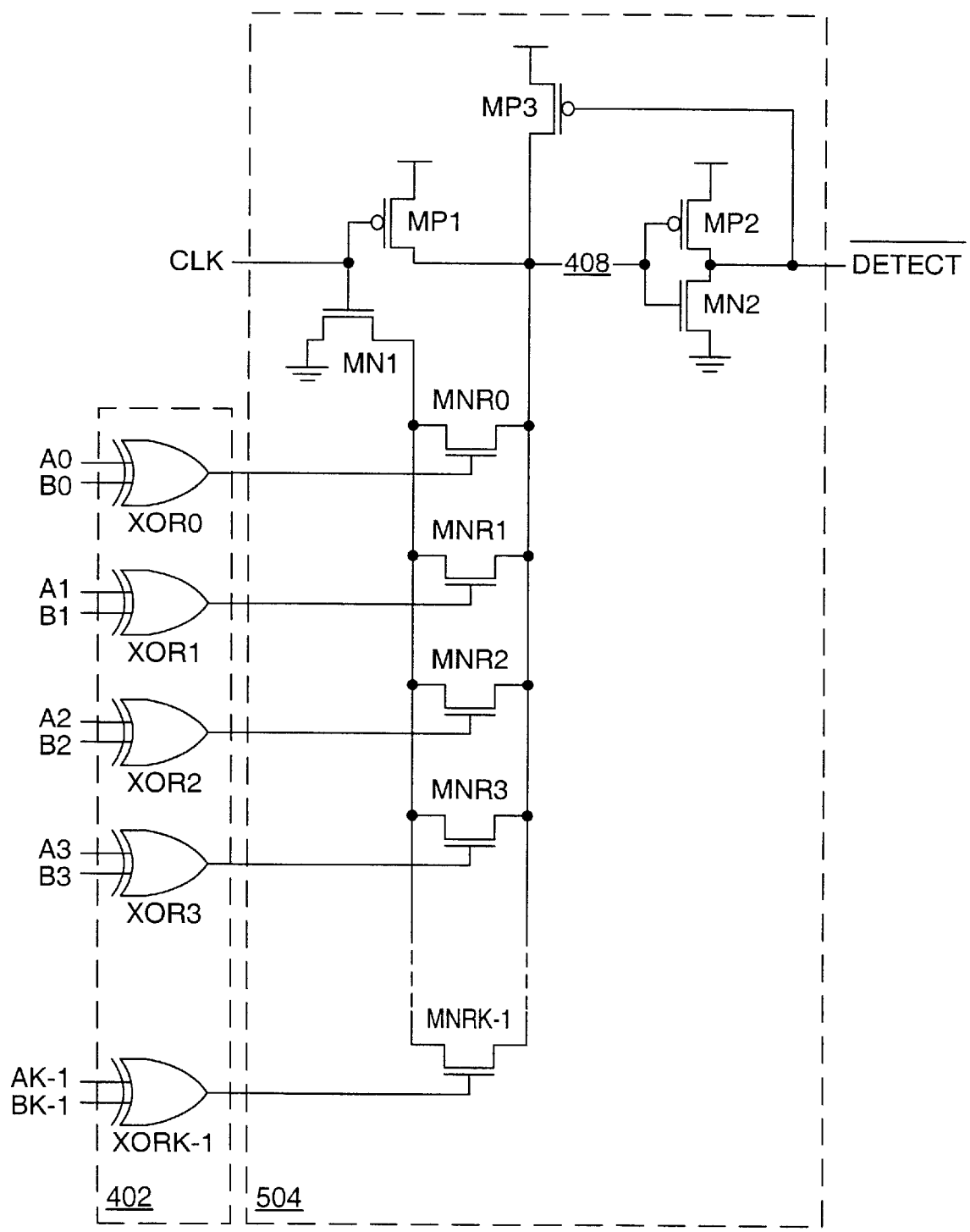
FIG. 5 depicts a circuit schematic for another fast compare circuit embodiment.

FIG. 5 shows an example of an alternative configuration 504 of the zero detector circuitry. In this configuration, the terminals of the bit transistors previously connected to ground in FIG. 4 are now connected to a common node 506. The clock transistor MN1 has been moved from between nodes 406, 408 to between common node 506 and ground. The circuit effectively operates in the same manner as that of FIG. 4, although the different transistor ordering may provide an advantageous layout.

The disclosed comparator embodiment advantageously provides for comparison of 64, 128, or more bits of data in one clock cycle. It advantageously avoids the large area requirements and speed restrictions of conventional comparator circuits where a large number of bits are employed. For example, a 64-bit zero detector using traditional 2 input logic requires 168 transistors and 6 gate delays. Using traditional 4 input logic, the number of transistors remains the same at 168, but only 4 gate delays are incurred. The disclosed zero detector would require only 69 transistors and incur only 2 gate delays. The performance penalty incurred in conventional systems is thereby avoided, allowing these memories to operate at significantly higher clock frequencies.

Numerous variations and modifications will become apparent to those skilled in the art once the above disclosure is fully appreciated. It is intended that the following claims be interpreted to embrace all such variations and modifications.

What is claimed is:

1. A zero-detector which comprises:
   a set of bit transistors coupled between a first node and a first predetermined voltage, wherein each bit transistor is configured to receive a respective bit and is configured to conduct when the respective bit is asserted;
   a first clock transistor coupled between the first node and a second node, wherein the first clock transistor is configured to conduct when a clock signal is asserted; and
   a second clock transistor coupled between a second predetermined voltage and the second node, wherein the second clock transistor is configured to conduct when the clock signal is de-asserted.

2. The zero-detector of claim 1, further comprising:
   a resistive element is coupled between the first node and the second predetermined voltage.

3. The zero-detector of claim 1, further comprising:
   a first inversion transistor coupled between an output node and the second predetermined voltage, wherein the first inversion transistor is configured to conduct when the second node is substantially at the first predetermined voltage; and
   a second inversion transistor coupled between the output node and the first predetermined voltage, wherein the second inversion transistor is configured to conduct when the second node is substantially at the second predetermined voltage.

4. The zero-detector of claim 3, further comprising:
   a weak transistor coupled between the second predetermined voltage and the second node.

5. The zero-detector of claim 4, wherein the weak transistor is configured to conduct when the output node is substantially at the first predetermined voltage.

6. The zero-detector of claim 1, wherein the first predetermined voltage is ground, wherein the second predetermined voltage is positive relative to ground, wherein the second clock transistor is a p-type transistor, and wherein the first clock transistor and the bit transistors are n-type transistors.

7. The zero-detector of claim 1, wherein the second predetermined voltage is ground, wherein the first predetermined voltage is positive relative to ground, wherein the second clock transistor is an n-type transistor, and wherein the first clock transistor and the bit transistors are p-type transistors.

8. A comparator which comprises:
   a front end configured to receive at least two words, wherein the front end is configured to provide a set of bit match signals each indicating whether corresponding respective bits of said at least two words match; and
   a zero-detector coupled to the front end to receive the bit match signals and configured to assert an output signal when all the bit match signals indicate a match.

9. The comparator of claim 8, wherein the front end comprises:
   a set of exclusive-or (XOR) gates, wherein each XOR gate is configured to generate a bit match signal from respective bits of said at least two words.

10. The comparator of claim 8, wherein the zero-detector comprises:
    a set of bit transistors coupled between a first node and a first predetermined voltage, wherein each bit transistor is configured to receive a respective bit match signal and is configured to conduct when the respective bit match signal is asserted;
    a first clock transistor coupled between the first node and a second node, wherein the first clock transistor is configured to conduct when a clock signal is asserted; and
    a second clock transistor coupled between a second predetermined voltage and the second node, wherein the second clock transistor is configured to conduct when the clock signal is de-asserted.

11. The comparator of claim 10, further comprising:

a first inversion transistor coupled between an output node and the second predetermined voltage, wherein the first inversion transistor is configured to conduct when the second node is substantially at the first predetermined voltage; and a second inversion transistor coupled between the output node and the first predetermined voltage, wherein the second inversion transistor is configured to conduct when the second node is substantially at the second predetermined voltage.

12. The comparator of claim 11, further comprising:

a weak transistor coupled between the second predetermined voltage and the second node.

13. The comparator of claim 12, wherein the weak transistor is configured to conduct when the output node is substantially at the first predetermined voltage.

14. The comparator of claim 10, wherein the first predetermined voltage is ground, wherein the second predetermined voltage is positive relative to ground, wherein the second clock transistor is a p-type transistor, and wherein the first clock transistor and the bit transistors are n-type transistors.

15. The comparator of claim 10, wherein the second predetermined voltage is ground, wherein the first predetermined voltage is positive relative to ground, wherein the second clock transistor is an n-type transistor, and wherein the first clock transistor and the bit transistors are p-type transistors.

16. An integrated circuit having a BIST unit that includes a comparator comprising:

a front end configured to receive an expected output word and an actual output word, wherein the front end is configured to provide a set of bit match signals each indicating whether corresponding respective bits of the output words match; and a zero-detector coupled to the front end to receive the bit match signals and configured to assert an output signal when all the bit match signals indicate a match.

17. The integrated circuit of claim 16, wherein the front end comprises:

a set of exclusive-or (XOR) gates, wherein each XOR gate is configured to generate a bit match signal from respective bits of the output words.

18. The integrated circuit of claim 16, wherein the zero-detector comprises:

a set of bit transistors coupled between a first node and a first predetermined voltage, wherein each bit transistor is configured to receive a respective bit match signal and is configured to conduct when the respective bit match signal is asserted;

a first clock transistor coupled between the first node and a second node, wherein the first clock transistor is configured to conduct when a clock signal is asserted; and a second clock transistor coupled between a second predetermined voltage and the second node, wherein the second clock transistor is configured to conduct when the clock signal is de-asserted.

19. The integrated circuit of claim 18, further comprising:

a first inversion transistor coupled between an output node and the second predetermined voltage, wherein the first inversion transistor is configured to conduct when the second node is substantially at the first predetermined voltage; and a second inversion transistor coupled between the output node and the first predetermined voltage, wherein the second inversion transistor is configured to conduct when the second node is substantially at the second predetermined voltage.

20. The integrated circuit of claim 19, further comprising:

a weak transistor coupled between the second predetermined voltage and the second node, wherein the weak transistor is configured to conduct when the output node is substantially at the first predetermined voltage.

21. A zero-detector which comprises:

a set of bit transistors coupled between a first node and a second node, wherein each bit transistor is configured to receive a respective bit and is configured to conduct when the respective bit is asserted;

a first clock transistor coupled between the first node and a first predetermined voltage, wherein the first clock transistor is configured to conduct when a clock signal is asserted; and a second clock transistor coupled between a second predetermined voltage and the second node, wherein the second clock transistor is configured to conduct when the clock signal is de-asserted.

* * * * *